(12) United States Patent
Shimoda et al.

(10) Patent No.: US 9,435,032 B2
(45) Date of Patent: Sep. 6, 2016

(54) METHOD FOR FORMING PATTERNED CONDUCTIVE FILM

(71) Applicant: JAPAN SCIENCE AND TECHNOLOGY AGENCY, Kawaguchi-shi (JP)

(72) Inventors: Tatsuya Shimoda, Nomi (JP); Yasuo Matsuki, Minato-ku (JP); Zhongrong Shen, Nomi (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 99 days.

(21) Appl. No.: 14/253,459

(22) Filed: Apr. 15, 2014

(65) Prior Publication Data

US 2014/0227436 A1 Aug. 14, 2014

Related U.S. Application Data

(62) Division of application No. 13/575,477, filed as application No. PCT/JP2011/052185 on Jan. 26, 2011, now Pat. No. 8,828,555.

(30) Foreign Application Priority Data

Jan. 28, 2010 (JP) ................. 2010-016674

(51) Int. Cl.
| | |
|---|---|
| *C23C 18/16* | (2006.01) |
| *C23C 18/10* | (2006.01) |
| *H05K 3/18* | (2006.01) |
| *C23C 18/06* | (2006.01) |
| *C23C 18/08* | (2006.01) |
| *C23C 18/42* | (2006.01) |
| *C23C 22/73* | (2006.01) |

(52) U.S. Cl.
CPC ........... *C23C 18/1603* (2013.01); *C23C 18/06* (2013.01); *C23C 18/08* (2013.01); *C23C 18/10* (2013.01); *C23C 18/42* (2013.01); *C23C 22/73* (2013.01); *H05K 3/182* (2013.01); *H05K 2203/0709* (2013.01); *H05K 2203/1105* (2013.01); *Y10T 428/12028* (2015.01); *Y10T 428/1275* (2015.01); *Y10T 428/12493* (2015.01); *Y10T 428/24917* (2015.01)

(58) Field of Classification Search
CPC ............... C23C 18/16; C23C 18/1603; H05K 2203/0709; H05K 2203/1105; H05K 3/182
USPC ......................... 427/126.4, 123, 126.5, 125
See application file for complete search history.

(56) References Cited

U.S. PATENT DOCUMENTS

| | | | |
|---|---|---|---|
| 3,879,572 A | 4/1975 | Shoji et al. | |
| 4,248,921 A | 2/1981 | Steigerwald et al. | |
| 4,552,691 A | 11/1985 | Shoji et al. | |
| 4,666,735 A | 5/1987 | Hoover et al. | |
| 5,191,099 A * | 3/1993 | Gladfelter | ....... C23C 16/20 556/176 |
| 5,653,918 A | 8/1997 | Towlson | |
| 6,171,710 B1 | 1/2001 | Ogino et al. | |
| 6,712,997 B2 | 3/2004 | Won et al. | |
| 6,824,857 B2 | 11/2004 | Lochun et al. | |
| 6,953,600 B2 | 10/2005 | Yokoyama et al. | |
| 7,550,513 B2 | 6/2009 | Hirakoso et al. | |
| 7,618,475 B2 | 11/2009 | Yamashina et al. | |
| 2003/0224152 A1 | 12/2003 | Yokoyama et al. | |
| 2005/0215721 A1* | 9/2005 | Kawamura | ....... G03F 7/029 525/286 |

FOREIGN PATENT DOCUMENTS

| | | |
|---|---|---|
| CN | 1461779 A | 12/2003 |
| CN | 101360851 A | 2/2009 |
| JP | 2004 6197 | 1/2004 |
| JP | 2004-006197 A | 1/2004 |
| JP | 2004-303783 A | 10/2004 |
| JP | 2006 75744 | 3/2006 |
| JP | 2006-075744 A | 3/2006 |
| JP | 3817201 B2 | 9/2006 |
| JP | 2007 146257 | 6/2007 |
| JP | 2007-146257 A | 6/2007 |
| WO | 2007/058604 A1 | 5/2007 |
| WO | 2009/078448 A1 | 6/2009 |

OTHER PUBLICATIONS

International Search Report Issued Apr. 12, 2011 in PCT/JP11/52185 Filed Jan. 26, 2011.
International Preliminary Report on Patentability Issued Sep. 18, 2012 in PCT/JP11/052185 Filed Jan. 26, 2011.
Combined Office Action and Search Report issued Jul. 19, 2013 in Chinese Patent Application No. 201180007388.2 (with English translation of Category of Cited Documents).
Hyunjoon Song, "Shape Control and Langmuir—Blodgett Monolayer Formation", J. Phys. Chem. B, vol. 109, No. 1, 2005, pp. 188-193.
John K. Ruff et al., "The Amine Complexes of Aluminum Hydride. I.", J. Am. Chem. Soc., vol. 82, May 5, 1960, pp. 2141-2144.
G. W. Fraser et al., "Aluminium Hydride Adducts of Trimethylamine: Vibrational Spectra and Structure", J. Chem. Soc., 1963, pp. 3742.
Jerry L. Atwood et al., "Tertiary Amine Stabilized Dialane", J. Am. Chem. Soc., vol. 113, No. 21, 1991, pp. 8183-8185.

* cited by examiner

*Primary Examiner* — Dah-Wei D Yuan
*Assistant Examiner* — Jose Hernandez-Diaz
(74) *Attorney, Agent, or Firm* — Oblon, McClelland, Maier & Neustadt, L.L.P.

(57) ABSTRACT

The present invention is directed to a method for forming a patterned conductive film, which comprises the step of bringing a substrate having a layer made of platinum microcrystal particles formed thereon in a pattern and a complex of an amine compound and an aluminum hydride into contact with each other at a temperature of 50 to 120° C. According to the present invention, there is provided a method for forming a patterned conductive layer, which can ensure electrical bonding with a substrate and also can be suitably applied to various electronic devices, simply without requiring a massive and heavy apparatus.

2 Claims, 2 Drawing Sheets

METHOD FOR FORMING PATTERNED CONDUCTIVE FILM

CROSS REFERENCE TO RELATED APPLICATIONS

The present application is a divisional of U.S. patent application Ser. No. 13/575,477, filed on Jul. 26, 2012, which is a 35 U.S.C. §371 national stage patent application of international patent application PCT/JP11/052185, filed on Jan. 26, 2011, which claims priority to Japanese patent application JP 2010-016674, filed on Jan. 28, 2010.

TECHNICAL FIELD

The present invention relates to a method for forming a patterned conductive film. More particularly, the present invention relates to a method for forming a patterned conductive film on a substrate, in which a main conductive layer is an aluminum layer, the method capable of ensuring electrical bonding between the aluminum layer and the substrate.

BACKGROUND ART

Aluminum is used as a material of wiring in various electronic devices such as a solar cell, a semiconductor device, and an electronic display device. Heretofore, it has generally been practiced to form such an aluminum film by a vacuum process such as a sputtering, vacuum deposition or chemical vapor deposition (CVD) method and to form a pattern by a photoetching method. Since this method requires a large-scale vacuum deposition device, not only is it disadvantageous in terms of energy consumption, but it is also difficult to uniformly form aluminum wiring on a substrate having a large surface area, resulting in poor yield and one of the causes of high costs.

In contrast, there has recently been proposed the technology in which a solution composition containing a complex of an amine compound and an aluminum hydride, and an organic solvent is applied on a substrate and then an aluminum film is formed by heating the solution composition (specification of Japanese Patent No. 3,817,201). This technology is an excellent technology which can form a satisfactory quality aluminum film by a simple method without requiring a massive and heavy apparatus. However, since this technology requires a pretreatment in which an organometallic compound of Ti, Pd or Al is applied on a substrate and then subjected to a heat treatment before application of the solution composition, the technology has such a drawback that a film made of an oxide of the metal is interposed in the space between the thus formed aluminum film and the substrate, thus failing to ensure electrical bonding between the substrate and the aluminum film.

SUMMARY OF INVENTION

The present invention has been made in view of the above circumstances and an object thereof is to provide a method for forming a patterned conductive layer, which can electrically bond to a substrate and also can be suitably applied to various electronic devices simply without requiring a massive and heavy apparatus.

According to the present invention, the above object and advantage of the present invention is achieved by a method for forming a patterned conductive film, which includes the step of bringing a substrate having a layer made of platinum microcrystal particles formed thereon in a pattern and a complex of an amine compound and an aluminum hydride into contact with each other at a temperature of 50 to 120° C.

A layer made of platinum microcrystal particles can be formed on a substrate in a pattern, for example, by a method in which a platinum microcrystal particle dispersion for formation of a layer is applied on a substrate in a pattern to form a coating film, and then a solvent is removed from the coating film followed by further heating.

DESCRIPTION OF EMBODIMENTS

Figure 1:
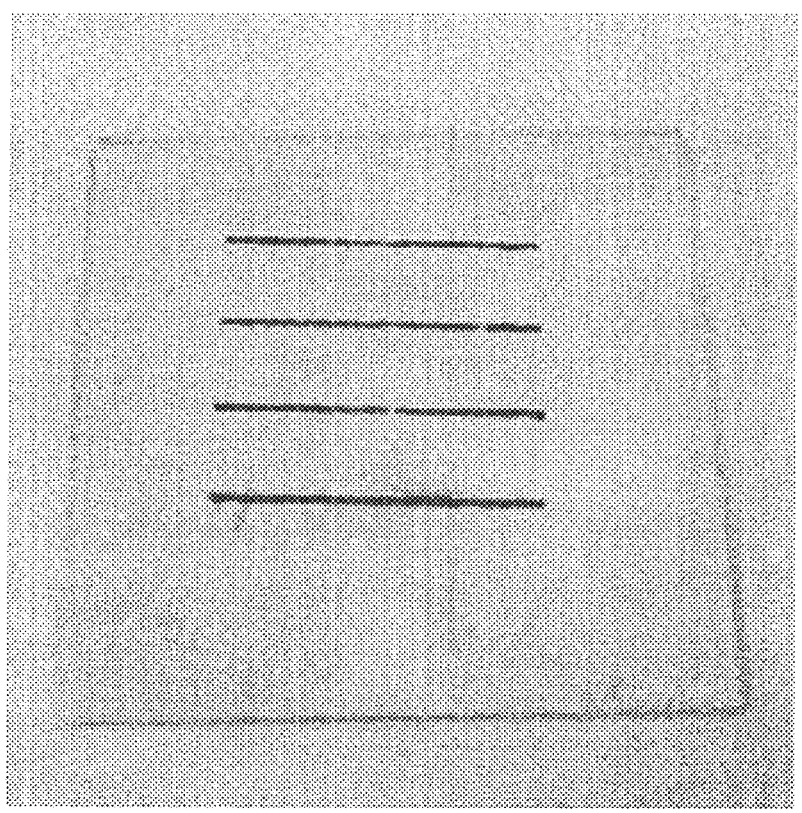
FIG. 1 is a photograph of a patterned conductive film obtained in Example 1.

The method for forming a patterned conductive film of the present invention is characterized by including the step of bringing a substrate having a layer made of platinum microcrystal particles formed thereon in a pattern, a complex of an amine compound and an aluminum hydride into contact with each other at a temperature of 50 to 120° C.

As used herein, the concept of "film" is to include a film having a desired pattern, and the film may be a continuous film in which one region of the conductive film is in direct contact with the other region adjacent to the region, or a discontinuous film in which two regions of a conductive film are adjacent through a region where a conductive film is not formed. Similarly, the concept of "layer" in the present description is to include a layer having a pattern. In case the "layer" is composed of particles, the respective particles composing the layer may be in contact with adjacent particles or not.

In the present invention, it is believed that a layer made of aluminum can be formed on a layer made of platinum microcrystal particles on a substrate by converting a complex of an amine compound and an aluminum hydride into aluminum through a catalytic action of platinum atoms in a layer made of platinum microcrystal particles formed on a substrate.

The present invention will be described in detail below.

<Platinum Microcrystal Particles>

Platinum microcrystal particles used in the present invention may be particles made of solid platinum metal having crystallinity, and it is preferred to use particles having a small particle diameter because of high catalytic efficiency of conversion of a complex of an amine compound and an aluminum hydride into aluminum metal. The average particle diameter of platinum microcrystal particles used in the present invention is preferably 15 nm or less, and more preferably 10 nm or less. The "crystal" in platinum microcrystal particles may be either a single crystal or a polycrystal. The concept of "particles" in the present description is to include, in addition to a spherical, nearly spherical or spheroid-shaped crystal, a solid which underwent crystal growth into a cuboctahedron-shaped crystal, a nearly octapod-shaped solid in which crystal is overgrown in the vicinity of a vertex of the cube, and a solid having a shape in which at least one of a vertex and a side of the shape is rounded.

Platinum microcrystal particles in the present invention are preferably provided with an appropriate protective colloid at the periphery.

Such platinum microcrystal particles can be synthesized in conformity with the method disclosed, for example, J. Phys. Chem. B, 109, 188 (2005). Specifically, platinum microcrystal particles can be produced, for example, by bringing a platinum complex compound, a primary alcohol having 2 to 12 carbon atoms, and a hydrophilic polymer into contact with each other in a polar solvent.

The respective components and contact conditions of these components used in the production of preferred platinum microcrystal particles in the present invention will be described according to procedures.

[Platinum Complex Compound]

A platinum complex compound used in the production of preferred platinum microcrystal particles in the present invention can be used without any limitation as long as it is a complex compound which can be converted into platinum metal by dissolving the compound in the below-mentioned polar solvent and reducing with the below-mentioned primary alcohol. The concept of "complex compound" as used herein is to include both a complex and a compound, and is to particularly include those mentioned below.

The platinum complex compound in the present invention is preferably a complex compound of platinum (II) or platinum (IV), and more preferably at least one selected from the group consisting of complex compounds represented by each of the following formulas (P1) to (P5):

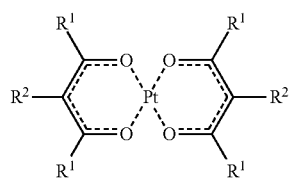
(P1)

wherein each $R^1$ in the formula (P1) is an alkyl group having 1 to 6 carbon atoms, an alkoxyl group having 1 to 6 carbon atoms, a fluoroalkyl group having 1 to 6 carbon atoms or a fluoroalkoxyl group having 1 to 6 carbon atoms, and each $R^2$ is a hydrogen atom or an alkyl group having 1 to 6 carbon atoms;

$$PtX_2 \cdot D_a \quad (P2)$$

wherein X in the formula (P2) is a halogen atom, D is a monoene ligand, a diene ligand, a thioether ligand which has an alkyl group having 1 to 6 carbon atoms, triarylphosphine or an aromatic ligand, and a is 1 or 2;

$$Pt(CO)_b X_c \quad (P3)$$

wherein X in the formula (P3) is a halogen atom, b is 0 or 2, and c is 2 or 4;

$$Pt(NH_3)_4 Y_2 Z_d \quad (P4)$$

wherein Y in the formula (P4) is a halogen atom, a hydroxyl group or a nitric acid ion ($NO_3^-$), Z is a water ligand and d is 0 or 1; and

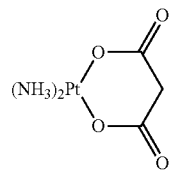
(P5)

and bis(dibenzylideneacetone)platinum, tris(dibenzylideneacetone)diplatinum, $H_2PtCl_6$, $[Pt(NH_3)_4][PtCl_4]$, $Pt(NH_3)_2Cl_4$ and $Pt(NH_3)_2(OCOCH_3)_2$. The above-mentioned $H_2PtCl_6$ may be used in the form of a salt such as a potassium salt or a sodium salt.

Examples of the alkyl group having 1 to 6 carbon atoms as $R^1$ in the formula (P1) include a methyl group, an ethyl group, an i-propyl group, a t-butyl group and the like; examples of the alkoxyl group having 1 to 6 carbon atoms as $R^1$ include a methoxyl group, an ethoxyl group, an i-propoxyl group, a t-butoxyl group and the like; examples of the fluoroalkyl group having 1 to 6 carbon atoms as $R^1$ include a trifluoromethyl group, a 2,2,2-trifluoroethyl group, a perfluoroethyl group and the like; and examples of the fluoroalkoxyl group having 1 to 6 carbon atoms as $R^1$ include a trifluoromethoxyl group, a 2,2,2-trifluoroethoxyl group, a perfluoroethoxyl group and the like; respectively. $R^1$ is preferably an alkyl group or a fluoroalkyl group having 1 to 6 carbon atoms, and more preferably a methyl group or a trifluoromethyl group. Examples of the alkyl group having 1 to 6 carbon atoms as $R^2$ in the formula (P1) include a methyl group, an ethyl group, a 2-propyl group, a t-butyl group and the like. $R^2$ is preferably a hydrogen atom.

Specific examples of the complex compound represented by the formula (P1) include platinum bis(acetylacetonato), platinum bis(1,1,1,5,5,5-hexafluoroacetylacetonato) and the like.

Examples of the halogen atom as X in the formula (P2) include a chlorine atom, a bromine atom, an iodine atom and the like. Examples of the monoene ligand as D include ethylene, propylene and the like; examples of the diene ligand include 1,5-hexadiene, norborna-2,5-diene, 1,3-cyclopentadiene, 1,5-cyclooctadiene, bicyclopentadiene and the like; examples of the thioether ligand which has an alkyl group having 1 to 6 carbon atoms include dimethylthioether, diethylthioether, diisopropylthioether and the like; examples of the triarylphosphine include triphenylphosphine, tritolylphosphine and the like; and examples of the aromatic ligand include pyridine, pyrimidine, triazine, cyanobenzene and the like; respectively. In the formula (P2), b is preferably 0 when c is 4.

Specific examples of the complex compound represented by the formula (P2) include $PtCl_2$ $(C_2H_4)_2$, $PtCl_2$ (1,5-hexadiene), $PtCl_2$ (norbornadiene), $PtCl_2$ (1,3-cyclopentadiene), $PtCl_2$ (1,5-cyclooctadiene), $PtBr_2$ (1,5-cyclooctadiene), $PtI_2$ (1,5-cyclooctadiene), $PtCl_2$ (bicyclopentadiene), $PtCl_2$ $(S(C_2H_5)_2)_2$, $PtCl_2$ (pyridine), $PtCl_2$(cyanobenzene) and the like. Among these complex compounds, $PtCl_2$ (bicyclopentadiene) is preferable.

Examples of the halogen atom as X in the formula (P3) include a chlorine atom, a bromine atom, an iodine atom and the like.

Specific examples of the complex compound represented by the formula (P3) include $Pt(CO)_2Cl_2$, $Pt(CO)_2Br_2$, $Pt(CO)_2I_2$, $PtCl_2$, $PtBr_2$, $PtI_2$, $PtCl_4$ and the like.

Examples of the halogen atom as X in the formula (P4) include a chlorine atom, a bromine atom, an iodine atom and the like.

Specific examples of the complex compound represented by the formula (P4) include $Pt(NH_3)_4Cl_2(H_2O)Pt(NH_3)_4(OH)_2(H_2O)$, $Pt(NH_3)_4(NO_3)_2$ and the like.

The platinum complex compound in the present invention to be used is preferably a complex compound of platinum (IV), and particularly preferably at least one selected from the group consisting of $H_2PtCl_6$, $K_2PtCl_6$ and $Na_2PtCl_6$.

[Primary Alcohol Having 2 to 12 Carbon Atoms]

A primary alcohol used in the production of preferred platinum microcrystal particles in the present invention is a component having a function of reducing platinum atoms in the above-mentioned platinum complex compound. This primary alcohol may be an alcohol compound having at least one primary hydroxyl group, and the concept thereof is to include a dihydric alcohol, and a polyhydric alcohol having a secondary or tertiary hydroxyl group in addition to a primary hydroxyl group.

The primary alcohol preferably has 2 to 10 carbon atoms. Specific examples of such primary alcohol include ethanol, 1-propanol, 1-butanol, 1-pentanol, 1-hexanol, 1-heptanol, 1-octanol, ethylene glycol, propylene glycol, glycerin and the like. Among these primary alcohols, at least one kind selected from the group consisting of 1-butanol, 1-hexanol, 1-octanol, ethylene glycol, propylene glycol and glycerin is preferably used.

[Hydrophilic Polymer]

A hydrophilic polymer in the present invention is a component which functions as a protective colloid of platinum microcrystal particles which play a role of carrying a platinum complex compound as a precursor of platinum through the colloid layer and allowing platinum microcrystal particles to grow by an additional reductive reaction. It is also an important component which stably disperse platinum microcrystal particles in a disperse medium in the below-mentioned platinum microcrystal particle dispersion for formation of a layer, thereby facilitating a coating operation in the formation of a layer made of platinum microcrystal particles.

Examples of the hydrophilic polymer used in the present invention include polyvinyl alcohol, polyvinylpyrrolidone, poly(meth)acrylic acid, cellulose (for example, carboxymethyl cellulose, hydroxyethyl cellulose, hydroxypropyl cellulose or the like), polyacrylamide, polyethylene oxide, polyethylene glycol, polyvinyl acetal, polyvinyl methyl ether, polyamine, polyethyleneimine, casein, gelatin, starch and the like. Among these hydrophilic polymers, polyvinylpyrrolidone or polyacrylamide is preferable.

The molecular weight of the hydrophilic polymer is preferably from 5,000 to 300,000, and more preferably from 10,000 to 100,000, in terms of a polystyrene-equivalent weight average molecular weight measured by gel permeation chromatography (GPC). It is preferred to use the hydrophilic polymer having a molecular weight within the above range since the reaction uniformly proceeds.

[Polar Solvent]

It is possible to suitably use, as the polar solvent, for example, an ether compound having a boiling point of 150° C. or higher, and specific examples thereof include methylanisole, ethylanisole, n-propylanisole, n-butylanisole, phenylanisole, ethyl phenyl ether, butyl phenyl ether, diphenylether and the like. It is preferred to use one or more selected from among these polar solvents.

[Contact Conditions]

In case of bringing the above-mentioned platinum complex compound, primary alcohol having 2 to 12 carbon atoms and hydrophilic polymer into contact with each other in a polar solvent, the amount of the respective components used are as follows.

The primary alcohol having 2 to 12 carbon atoms is preferably used in the amount of 1 to 100 mol, and more preferably 1 to 80 mol, based on 1 mol of the platinum complex compound. The hydrophilic polymer is preferably used in the amount of 10 to 100 parts by weight, and more preferably 30 to 70 parts by weight, based on 100 parts by weight of the platinum complex compound. The amount of the polar solvent used is preferably set so that the concentration of the solid component in a contact liquid (ratio of the total weight of components other than the solvent in the liquid, which accounts for the whole weight of the liquid) is preferably 0.1 to 50% by weight, and more preferably 1 to 20% by weight.

The contact temperature is preferably adjusted to 100 to 200° C., and more preferably 150 to 200° C., and the contact time is preferably adjusted to 5 to 240 minutes, and preferably adjusted to 30 to 120 minutes.

In the manner mentioned above, a dispersion containing platinum microcrystal particles is obtained. It is possible to recover platinum microcrystal particles from this dispersion by appropriate means such as centrifugal separation.

<Complex of Amine Compound and Aluminum Hydride>

An aluminumhydride (often conventionally called "alan") is a compound composed of aluminum and hydrogen atoms, and it is generally believed that the aluminum hydride has the rational formula represented by $AlH_3$.

An amine compound composing a complex of an amine compound and an aluminum hydride in the present invention is represented by the following formula (1):

$$NR^I_3 \qquad (1)$$

wherein $R^I$ in the formula (1) is a hydrogen atom, an alkyl group having 1 to 12 carbon atoms, an alkenyl group, an alkynyl group, cyclic alkyl group or an aryl group, existing three $R^I$(s) may be the same or different from each other, and a plurality of $R^I$(s) may be combined to form a ring.

It is possible to suitably use, as specific examples of $R^I$ in the formula (1), hydrogen, a saturated alkyl groups such as hydrogen, a methyl group, an ethyl group, a propyl group, a butyl group, a pentyl group, a hexyl group, a heptyl group, an octyl group, a nonyl group, a decyl group, an undecyl group or a dodecyl group; an alkenyl group having an unsaturated group, such as a methallyl group; an alkynyl group such as a phenylethynyl group; a cyclic alkyl group such as a cyclopropyl group; a group having an aryl group such as a phenyl group or a benzyl group; and the like. These alkyl group, alkenyl group and alkynyl group may be linear, cyclic or branched.

It is possible to use, as specific examples of the amine compound represented by the formula (1), ammonia, trimethylamine, triethylamine, tri-n-propylamine, tri-isopropylamine, tricyclopropylamine, tri-n-butylamine, triisobutylamine, tri-t-butylamine, tri-2-methylbutylamine, tri-n-hexylamine, tricyclohexylamine, tri(2-ethylhexyl)amine, trioctylamine, triphenylamine, tribenzylamine, dimethylphenylamine, diethylphenylamine, diisobutylphenylamine, methyldiphenylamine, ethyldiphenylamine, isobutyldiphenylamine, dimethylamine, diethylamine, di-n-propylamine, diisopropylamine, dicyclopropylamine, di-n-butylamine, diisobutylamine, di-t-butylamine, methylethylamine, methylbutylamine, di-n-hexylamine, dicyclohexylamine, di(2- ethylhexyl)amine, dioctylamine, diphenylamine, dibenzylamine, methylphenylamine, ethylphenylamine, isobutylphenylamine, methylmethacrylamine, methyl(phenylethynyl)amine, phenyl(phenylethynyl)amine, methylamine, ethylamine, n-propylamine, isopropylamine, cyclopropylamine, n-butylamine, isobutylamine, t-butylamine, 2-methylbutylamine, n-hexylamine, cyclohexylamine, 2-ethylhexylamine, octylamine, phenylamine, benzylamine, ethylenediamine, 1-aza-bicyclo[2.2.1]heptane, 1-aza-bicyclo[2.2.2]octane (quinuclidine), 1-azacyclohexane, 1-azacyclohexan-3-ene, N-methyl-1-azacyclohexane-3-ene, morpholine, N-methylmorpholine, N-ethylmorpholine, piperazine and the like. Among these amine compounds, an amine compound which has an alkyl group having 1 to 8 carbon atoms is preferably used, and triethylamine, tri-n-butylamine, tri-n-hexylamine or tri-n-octylamine is particularly preferably used. These amine compounds can be used alone, or two or more kinds of compounds can be used in combination.

A complex of an amine compound and an aluminum hydride in the present invention can be synthesized using the amine compound in conformity with the methods disclosed, for example, in J. Am. Chem. Soc., 82, 2141 (1960); J. Chem. Soc., 3742 (1963); and J. Am. Chem. Soc., 113, 8183 (1991).

The complex of an amine compound and an aluminum hydride can be obtained, for example, by converting the amine compound into an acid salt and reacting the acid salt with lithium aluminum hydride, preferably in an ether solvent. Examples of the acid used in the acid salt of the amine compound include hydrochloric acid, hydrobromic acid and the like. The amount of the acid salt of the amine compound used is preferably from 1 to 5 mol, and more preferably from 1 to 3 mol, based on 1 mol of lithium aluminum hydride.

Examples of the ether solvent used preferably in case of contacting the acid salt of the amine compound with lithium aluminum hydride include diethylether, ethylene glycol dimethyl ether, ethylene glycol diethyl ether, ethylene glycol di-n-propyl ether, ethylene glycol diisopropyl ether, ethylene glycol di-n-butyl ether, ethylene glycol ethyl ether acetate, diethylene glycol dimethyl ether, diethylene glycol diethyl ether, diethylene glycol monomethyl ether acetate, diethylene glycol monoethyl ether acetate, tetrahydrofuran, dioxane and the like.

The amount of the solvent used is preferably from 1 to 50% by weight, and more preferably from 1 to 20% by weight, in terms of the concentration of the solid component (ratio of the total weight of an acid salt of an amine compound, and lithium aluminum hydride in the reaction solution, which accounts for the whole weight of the reaction solution). The reaction temperature is preferably adjusted to 25 to 200° C., and more preferably 50 to 150° C. The reaction time is preferably adjusted to 0.1 to 10 hours, and more preferably 0.5 to 5 hours.

Thus, the reaction mixture containing a complex of an amine compound and an aluminum hydride can be obtained. It is preferred to use a complex of an amine compound and an aluminum hydride after isolating from the reaction mixture. It is believed that the complex of an amine compound and an aluminum hydride exists as a mixture of a monoadduct in which n is 1 and a diadduct in which n is 2 in the following formula (2):

$$AlH_3 \cdot (NR^I{}_3)_n \qquad (2)$$

wherein $R^I$ in formula (3) is as defined in the formula (1), and a person with an ordinary skill in the art often express it as the following formula (2'):

$$AlH_3 \cdot (NR^I{}_3)_{1.x} \qquad (2')$$

wherein $R^I$ in formula (2') is as defined in the formula (1), and "1.x" represents an unspecific numerical value within a range from 1 to 2. Use of a mixture of a monoadduct and a diadduct in which a numerical value n in the formula (2) is not specified, as a complex of an amine compound and an aluminum hydride in the present invention, will be sufficient. Hereinafter, a general complex of an amine compound and an aluminum hydride, which includes such an aspect in the present description may be sometimes abbreviated to an "alan complex".

<Substrate Having Layer Made of Platinum Microcrystal Particles Formed Thereon>

In the method for forming a patterned conductive film of the present invention, a substrate having a layer made of platinum fine particles formed thereon in a pattern, is used. As mentioned below, in the method of the present invention, conversion of an alan complex into aluminum metal occurs only in the region where a layer made of platinum microcrystal particles on a substrate exists. Therefore, by forming this layer made of platinum microcrystal particles in a desired pattern, an aluminum film having the same pattern is formed on the desired pattern, and thus a patterned conductive film, which is a two-layered film including a first layer made of platinum fine particles and a second layer made of aluminum, is formed on a substrate.

A layer made of platinum microcrystal particles is preferably formed on a substrate in a pattern by a method in which an appropriate substrate is prepared and a platinum microcrystal particle dispersion for formation of a layer is applied on the substrate in a pattern to form a coating film and, after removing a solvent from the coating film, the substrate is further heated so that a protective colloid possessed preferably by platinum microcrystal particles is removed.

[Substrate]

There is no particular limitation on the material and shape of a substrate used in the present invention.

However, the material of the substrate is preferably a material which can endure a heat treatment of the subsequent step. Specific examples of the material of the substrate include glass, metal, semiconductor, plastic, ceramics and the like. Examples of the glass include quartz glass, borosilicate glass, soda-lime glass, lead glass and the like; examples of the metal include, in addition to gold, silver, copper, nickel, aluminum, iron and the like, an alloy containing these metals, for example, stainless steel; examples of the semiconductor include silicon, germanium and the like; and examples of the plastic include polyimide, polyethersulfone and the like; respectively. One of advantages of the present invention lies in ensuring electrical bonding between the thus formed aluminum layer and the substrate by the interposition of a layer made of platinum microcrystal particles. In order to make the best of such a feature, the material of the substrate is preferably metal or semiconductor, and particularly preferably silicon.

There is no particular limitation on the shape of the substrate, and the substrate may be a substrate having a plane portion, or a substrate composed only of a non-plane having a step or a curved surface. Specific examples thereof include a substrate having a shape of a plate, a disk or a film.

There is no particular limitation on the size of the substrate.

[Platinum Microcrystal Particle Dispersion for Formation of Layer]

The platinum microcrystal particle dispersion used for the formation of a layer is preferably a dispersion in which the above-mentioned platinum microcrystal particles is dispersed in an appropriate disperse medium.

Examples of disperse medium as used herein include alcohol, ether and the like.

It is preferred to use, as the alcohol, for example, an aliphatic alcohol having 1 to 4 carbon atoms. Specific examples thereof include ethanol, n-propanol, isopropanol, n-butanol and the like; and examples of the ether include diethylether, di-n-butylether, ethylene glycol dimethyl ether, ethylene glycol diethyl ether, tetrahydrofuran, dioxane and the like; respectively.

The content of platinum microcrystal particles in the platinum microcrystal particle dispersion is preferably from 0.01 to 10% by weight, and more preferably from 0.1 to 5% by weight.

The platinum microcrystal particle dispersion can be prepared by a method in which the above-mentioned disperse medium and platinum microcrystal particles are mixed with each other, and then platinum microcrystal particles are dispersed in a disperse medium by appropriate methods, for example, mechanical stirring, application of ultrasonic wave, stirring by bubbling of a gas into a liquid, and a combination thereof.

[Method for Formation of Layer Made of Platinum Microcrystal Particles]

In order to apply a platinum microcrystal particle dispersion on a substrate, it is possible to employ known coating methods, for example, a spin coating method, a dip coating method, a curtain coating method, a roll coating method, a spray coating method, an inkjet printing method, a flexo-printing method, an offset printing method, a stamping method and the like. The stamping method means a method in which a platinum microcrystal particle dispersion is stamped on a substrate in a pattern using a stamp having a protruding surface corresponding to a desired pattern. Among these methods, an inkjet printing method or a stamping method is preferably used since the amount of platinum microcrystal particle dispersion required for a coating operation can be reduced and a layer made of platinum microcrystal particles with an optional pattern can be easily formed on a substrate.

After application of the platinum microcrystal particle dispersion on a substrate, a solvent can be easily removed, for example, by leaving the substrate after application to stand at a temperature of 25 to 150° C. for 1 to 30 minutes, for example.

Then, the coating film after removal of the solvent is further heated. Thereby removing a protective colloid from platinum microcrystal particles, and thus a layer made of platinum microcrystal particles can be formed on a substrate in a pattern. Heating is preferably carried out at 300 to 1,000° C., more preferably 400 to 500° C., for preferably 1 to 60 minutes, and more preferably 2 to 10 minutes.

The thickness of the thus formed layer made of platinum microcrystal particles is preferably adjusted to 5 to 50 nm, and more preferably 10 to 20 nm.

<Contact of Substrate Having Layer Made of Platinum Microcrystal Particles Formed Thereon in Pattern with Alan Complex>

Then, the thus obtained substrate having a layer made of platinum microcrystal particles formed thereon in a pattern is brought into contact with the above-mentioned alan complex at a temperature of 50 to 120° C., thereby making it possible to form a layer made of aluminum on a layer made of platinum microcrystal particles on the substrate. Thus, a patterned conductive film of the present invention can be obtained.

Examples of the method for bringing into contact the thus obtained substrate having a layer made of platinum microcrystal particles formed thereon in a pattern with the alan complex include:

(1) a method in which a solution composition of an alan complex is applied on a substrate having a layer made of platinum microcrystal particles formed thereon in a pattern to form a coating film, and then the coating film is heated (contact method 1), (2) a method in which, while heating a substrate having a layer made of platinum microcrystal particles formed thereon in a pattern, a solution composition of an alan complex, which is heated or not, is applied on the substrate (contact method 2), and (3) a method in which a substrate having a layer made of platinum microcrystal particles formed thereon in a pattern is immersed in a heated solution composition of an alan complex (contact method 3). In case of employing the contact method 1 or 2 as the contact method, it is possible to use, as the method of applying an alan complex solution composition, a method which is the same as that mentioned above as the method of applying a platinum microcrystal particle dispersion on a substrate.

[Solution Composition of Alan Complex]

The solution composition of an alan complex used preferably for the formation of a coating film is a solution composition in which the above-mentioned alan complex is dissolved in an appropriate solvent, and preferably a composition which further contains a long-chain amine.

This long-chain amine is a component which is used for the purpose of avoiding an alan complex in which an amine compound has been eliminated by heating from inactivation due to polymerization when contacting a substrate having a layer made of platinum microcrystal particles formed thereon with an alan complex, in case of particularly using an alan complex prepared by using an amine compound which has an alkyl group having about 4 carbon atoms or less.

It is preferred to use, as a long-chain amine, a compound represented by the following formula (3):

$$NR^{II}R^{III}_2 \qquad (3)$$

wherein $R^{II}$ in formula (3) is an alkyl group having 6 to 15 carbon atoms, and $R^{III}$ is a hydrogen atom or an alkyl group having 1 to 4 carbon atoms. Examples of the long-chain amine include N,N-dimethyloctylamine, N,N-dimethyldecylamine, N,N-dimethyldodecylamine, N,N-dimethylcetylamine, N,N-diethyloctylamine, N,N-diethyloleylamine and the like, and at least one selected from among these amines is preferably used.

The amount of the long-chain amine used is preferably adjusted to 10 mol or less, more preferably 0.1 to 5 mol, and particularly preferably 0.5 to 3 mol, based on 1 mol of the alan complex.

It is possible to suitably use, as the solvent used preferably in a solution composition of an alan complex, for example, an ether compound having a boiling point of 150° C. or higher, and specific examples thereof include methylanisole, ethylanisole, n-propylanisole, n-butylanisole, phenylanisole, ethyl phenyl ether, butyl phenyl ether, diphenylether and the like. It is preferred to use one or more selected from these solvents.

The amount of the solvent used is preferably adjusted to 0.1 to 50% by weight, and more preferably 1 to 20% by weight, in terms of the concentration of the solid component (ratio of the total weight of components other than the solvent in the composition, based on the whole weight of the composition) of a solution composition of an alan complex.

[Contact Conditions]

In case of bringing a substrate having a layer made of platinum microcrystal particles formed thereon in a pattern into contact with an alan complex, the heating temperature is preferably set within a range from 50 to 120° C., more preferably from 80 to 120° C., still more preferably from 100 to 120° C., and particularly preferably from 100 to 120° C. This heating temperature means a heating temperature after application of an alan complex solution composition on a substrate in case of employing the contact method 1 as the contact method; a heating temperature of a substrate having a layer made of platinum microcrystal particles formed thereon in a pattern in case of employing the contact method 2; or a heating temperature of an alan complex solution composition in case of employing the contact method 3.

The contact time is preferably adjusted to 0.1 to 12 hours, and more preferably 1 to 5 hours. This heating time means a heating time after application of an alan complex solution composition on a substrate in case of employing the contact method 1 as the contact method; a time during which a substrate is maintained at the above temperature after a substrate having a layer made of platinum microcrystal particles formed thereon in a pattern is contacted with an alan complex solution composition in case of employing the contact method 2; and an immersion time at the above temperature in case of employing the contact method 3.

It is preferred that contact between a substrate having a layer made of platinum microcrystal particles formed thereon in a pattern and an alan complex is carried out by the contact method 3.

In a substrate region where platinum exists, the alan complex is converted into aluminum metal by a catalytic action of platinum as a result of the contact, such conversion does not occur in a substrate region where platinum does not exist. Since the alan complex remaining on the substrate is easily removed by washing the substrate with an appropriate solvent (for example, toluene, methylanisole or the like), it is possible to form a layer made of aluminum having the same pattern as the pattern of the layer made of platinum microcrystal particles only at a region where a layer made of platinum microcrystal particles on a substrate has been formed, and thus making it possible to form a patterned conductive film which is a two-layered film including a first layer made of platinum fine particles formed on the substrate and a second layer made of aluminum formed on the first layer.

In order to change an aluminum layer of the thus formed patterned conductive film into a more dense layer, heating is further carried out, preferably. This heating temperature is preferably adjusted to 300 to 500° C., and more preferably 350 to 500° C. The heating time is preferably adjusted to 1 to 60 minutes, and more preferably 3 to 30 minutes.

It is preferred that the above-mentioned contact between substrate having a layer made of platinum microcrystal particles formed thereon in a pattern and alan complex is carried out under an inert atmosphere (in an inert gas, for example, nitrogen, argon or the like) or under a reducing atmosphere (for example, a mixed gas composed of a reducing gas such as hydrogen and the above mentioned inert gas).

[Conductive Film]

In the manner mentioned above, a patterned conductive film, which is a two-layered film including a first layer made of platinum fine particles and a second layer made of aluminum formed on the first layer, is formed on a substrate. An aluminum layer in a patterned conductive film, which is formed by the method of the present invention, may be either a pure aluminum layer made substantially of only aluminum atoms, or an aluminum-platinum alloy layer containing a small amount of platinum atoms in which platinum atoms in platinum fine particles are migrated into aluminum.

The thickness of this aluminum layer can be adjusted to 10 to 300 nm, and can also be adjusted to 50 to 200 nm.

A patterned conductive film formed by a method of the present invention is excellent in conductivity since a main conductive layer is an aluminum layer. A specific resistance value of a patterned conductive film in the present invention can be adjusted to 50 $\mu\Omega\cdot$cm or less, preferably 20 $\mu\Omega\cdot$cm, more preferably 10 $\mu\Omega\cdot$cm or less, and particularly preferably 5 $\mu\Omega\cdot$cm or less or 3 $\mu\Omega\cdot$cm or less.

An aluminum layer in the patterned conductive film formed by a method of the present invention can ensure electrical bonding with a substrate through a first layer made of platinum microcrystal particles. Therefore, in case of using a semiconductor substrate as a substrate, a gate electrode, a source electrode, a drain electrode and the like, which utilize semiconductive properties of a substrate, can be easily formed. Alternatively, in case of using a substrate for solar cell as a substrate, a collecting electrode or the like can be easily formed.

EXAMPLES

Synthesis Example 1

Synthesis of Platinum Microcrystal Particles

In conformity with the method disclosed in J. Phys. Chem. B, 109, 188 (2005), platinum microcrystal particles were synthesized.

A solution prepared by dissolving 0.26 g of dihydrogen hexachloroplatinum and 0.66 g of polyvinylpyrrolidone (PVP, Mw=55,000) in 51 mL of ethylene glycol was heated. When the temperature of the solution reached 135° C., the color of the solution changed to a dark brown color from a yellow color. After setting the solution temperature to 150° C., the reaction was carried out for additional 1 hour under heating. After completion of the reaction, the reaction mixture was left standing to cool to room temperature and then a precipitate was recovered by centrifugal separation. After purifying the precipitate by repeating the operation of introducing the precipitate into a mixed solvent of ethanol and n-hexane (in a mixing ratio (ethanol/hexane) of 1:3 (volume ratio)), re-dispersing the precipitate by applying ultrasonic wave and then recovering the precipitate again by centrifugal separation, three times, the solvent was sufficiently removed from a finally recovered product under reduced pressure to obtain 100 mg of the objective platinum microcrystal particles as a black power.

The thus obtained platinum microcrystal particles were observed by a scanning electron microscope. As a result, it was found that the average particle diameter of the obtained platinum microcrystal particles is 7.5 nm. The results of differential thermal analysis revealed that this platinum microcrystal particles are stabilized by a protective colloid made of 19% by weight of PVP based on the total weight of fine particles.

Preparation Example 1

Preparation of Platinum Microcrystal Particle Dispersion for Formation of Layer

Platinum microcrystal particles (100 mg) obtained in aforementioned Synthesis Example 1 was introduced into 10 mL of ethanol and dispersed by applying ultrasonic wave for 10 minutes to prepare a platinum microcrystal particle dispersion having the concentration of 10 mg/mL.

Synthesis Example 2

Synthesis Example of Alan Complex

In conformity with the method disclosed in J. Am. Chem. Soc., 82, 2141 (1960), an alan complex was synthesized.

In a flask filled with dry nitrogen, 2.0 g of lithium aluminum hydride and 150 mL of dry diethylether were charged and also 7.3 g of a triethylamine hydrochloric acid salt was added, in two batches. The obtained mixture was reacted by stirring at room temperature for 20 minutes. After completion of the generation of a gas from the reaction system, insoluble matters were removed by filtration to obtain a diethylether solution of an alan complex. The solvent was removed from this solution under reduced pressure to obtain 6.1 g of an alan complex in a state of a colorless transparent liquid (in a yield of 88%). The results of $^1$H-NMR analysis of this alan complex revealed that the alan complex is a triethylamine complex of an aluminum hydride (N/Al=1.1 (atomic ratio)).

Preparation Example 2

Preparation of Solution Composition of Alan Complex

In 6 mL of a 4-methylanisole solution, 0.2 mL of the alan complex obtained in aforementioned Synthesis Example 2 and 0.2 mL of N,N-dimethyloctylamine were dissolved to prepare a solution composition of an alan complex.

Example 1

Formation of Layer Made of Platinum Microcrystal Particles

The platinum microcrystal particle dispersion prepared in aforementioned Preparation Example 1 was applied on a glass substrate (measuring about 20 mm×about 20 mm×about 0.7 mm, manufactured by Nippon Electric Glass Co., Ltd. under a product name of "OA-10") in a pattern by an ink-jet method. Then, after removing a solvent by heating in air at 100° C. for 5 minutes, a protective colloid made of PVP was removed by heating in air at 492° C. for 30 minutes to form a patterned layer made of platinum microcrystal particles on a glass substrate.

Regarding the pattern of the layer formed herein, four linear patterns each measuring about 200 μm in width, about 10 mm in length and about 100 nm in height are arranged nearly in parallel to one another nearly in the center of a substrate through a space of about 3 mm.

<Formation of Patterned Conductive Film>

A substrate including a patterned layer made of platinum microcrystal particles was carried in a glove box filled with nitrogen, adjusted to the oxygen concentration of 10 ppm by volume or less, and then immersed in the solution composition of the alan complex prepared in aforementioned preparation Example 2. The solution was heated while immersing the substrate in the solution, and the solution temperature was maintained within a range from 110 to 120° C. for 2 hours. The substrate was taken out from the solution and left standing to cool to room temperature, and then sufficiently washed with dehydrated toluene. In order to further densify the formed film, additional heating was carried out under a nitrogen atmosphere at 500° C. for 5 minutes to obtain a patterned coating film. With respect to this film, ESCA was measured. As a result, a peak, which should be attributed to 2p orbitals of aluminum metal atoms, was observed at 71.8 eV, and the results revealed that this coating film is a layer made of aluminum.

The above results revealed that it is possible to obtain a patterned conductive film including a first layer made of platinum microcrystal particles formed on a substrate and a second layer made of aluminum formed on the first layer by the operation of the present Example.

The pattern of the conductive film formed herein was the same pattern as that of the above layer made of platinum microcrystal particles. A photograph of the patterned conductive film formed herein is shown in FIG. 1.

Example 2

Formation of Layer Made of Platinum Microcrystal Particles

On a silicon substrate measuring 2 cm×2 cm, the platinum microcrystal particle dispersion prepared in aforementioned Preparation Example 1 was spin-coated and then a protective colloid made of PVP was removed by heating in air at 500° C. for 5 minutes to form a layer made of platinum microcrystal particles on a glass substrate. This layer had an average thickness of 10 nm.

On the platinum microcrystal particles layer obtained above, PAK-01 (UV resin for nanoimprint, manufactured by Toyo Gosei Co., Ltd.) was applied by spin coating and then a pattern of a mold was transferred to a resin for nanoimprint by pressurizing under a pressure of 200 Pa by a patterned mold having a line-and-space pattern measuring 20.0 μm in line width, 500 nm in line height and 20.0 μm in space width. Then, platinum microcrystal particles at the position corresponding to a space region of a resin for nanoimprint were removed by a dry etching method using argon plasmon. Furthermore, the remaining resin for nanoimprint was removed by heating in air at 500° C. for 5 minutes to form a line-and-space patterned layer made of platinum microcrystal particles.

<Formation of Patterned Conductive Film>

In the same manner as in aforementioned Example 1, except that the substrate having an and-space patterned layer obtained above was used, immersion in a solution composition of an alan complex, washing with dehydrated toluene and additional heating were carried out to obtain a coating film having a thickness of about 200 nm only at a pattern region made of platinum microcrystal particles. The results of ESCA analysis revealed that the coating film formed herein is a metal layer made of aluminum.

With respect to the patterned conductive film obtained herein, specific resistance was measured by a four-point probe method. As a result, it was 2.9 μΩ·cm.

<Optical Microscope Observation>

Figure 2:
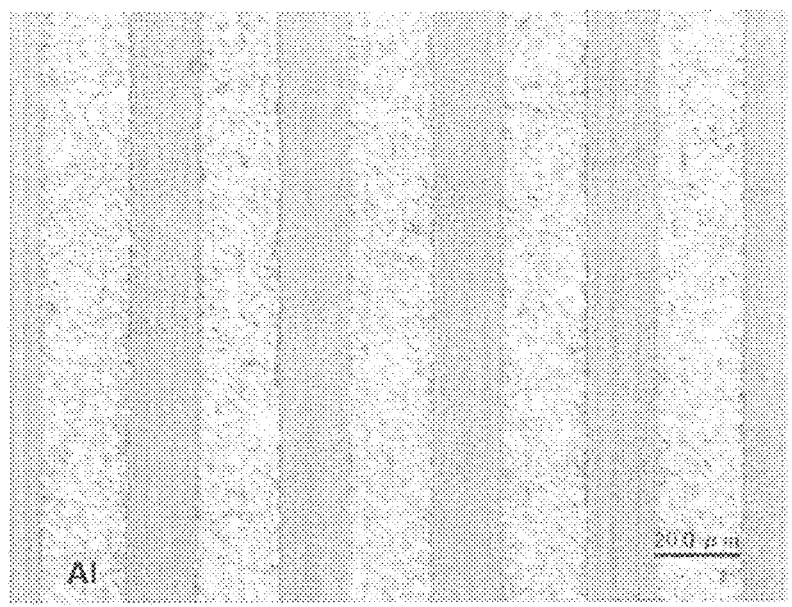
FIG. 2 is an optical microscope image of a patterned conductive film obtained in Example 2.

An optical microscope image of the patterned film formed above is shown in FIG. 2.

<Transmission Electron Microscope (TEM) Observation>

With respect to the patterned film obtained herein, preparation of samples and TEM observation were carried out by the following apparatus and conditions.

First, a carbon vapor-deposited film and a focused ion beam (FIB)-assisted tungsten film were coated for protection of an outermost surface, and then a small sample was obtained by micro-sampling. After thinning the sample by FIB processing, alleviation of FIB damage and additional thinning were carried out by Ar ion milling. Using the thus obtained sample, TEM observation was carried out.

[Ion Beam Processing]

Apparatus: Focused Ion Beam Processing System, Model "FB-2000A", manufactured by Hitachi, Ltd.

Acceleration voltage: 30 kV

[Ion Milling]

Apparatus: Ion Milling System, Model "PIPS Model-691", manufacture by GATAN, Inc.

Acceleration voltage: 2 kV

[TEM Observation]

Apparatus: Field Emission Transmission Electron Microscope, Model "JEM-2100F", manufactured by JEOL, Ltd.

Acceleration voltage: 200 kV

Figure 3:
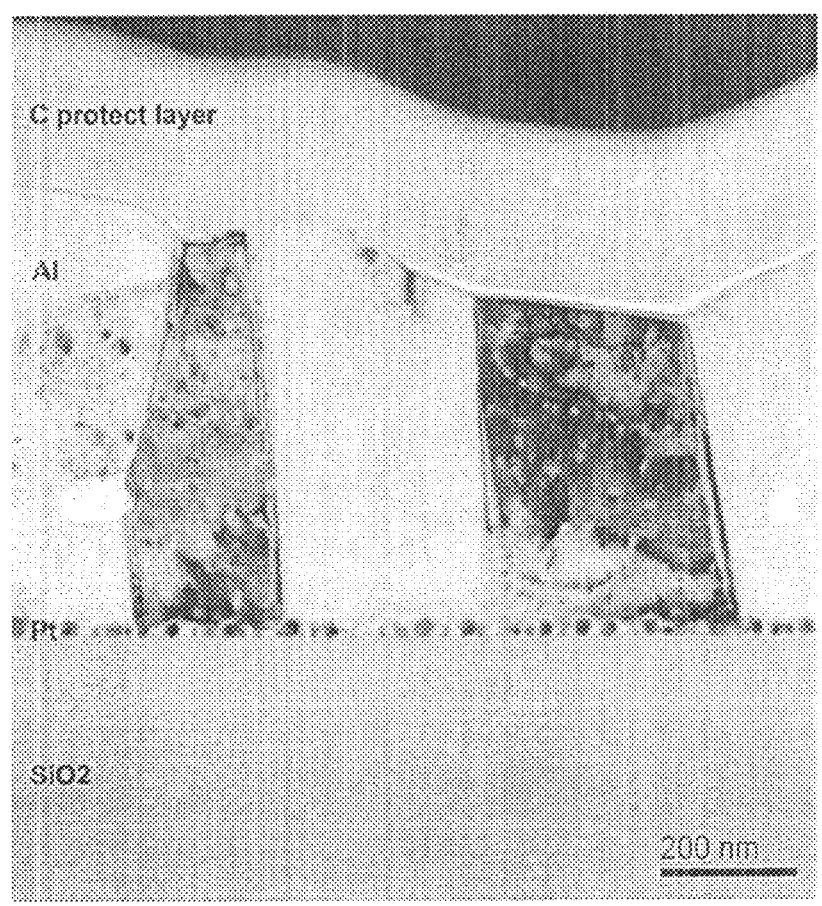
FIG. 3 is a cross-sectional TEM image of a patterned conductive film obtained in Example 2.

A cross-sectional TEM image obtained above is shown in FIG. 3. A white region and a metal color region are observed in an aluminum layer in FIG. 3 since both regions differ in crystal orientation.

The invention claimed is:

1. A method for forming a patterned conductive film, the method comprising:
    bringing a substrate and a complex of an amine compound and an aluminum hydride into contact with each other at a temperature of 50 to 120° C.,
    wherein the substrate has a layer made of platinum microcrystal particles formed thereon in a pattern and the platinum microcrystal particles are crystalline platinum cubes obtained by a method comprising bringing a platinum complex compound;
    an acid;
    a primary alcohol having 2 to 12 carbon atoms; and
    a hydrophilic polymer,
    into contact with each other in a polar solvent.

2. The method according to claim 1, wherein the platinum microcrystal particles have an average particle diameter of 15 nm or less.

* * * * *